United States Patent
Jayaraman et al.

(10) Patent No.: US 11,417,407 B1
(45) Date of Patent: Aug. 16, 2022

(54) STRUCTURES AND METHODS OF IDENTIFYING UNPROGRAMMED BITS FOR ONE-TIME-PROGRAMMABLE-MEMORY (OTPM)

(71) Applicant: GLOBALFOUNDRIES U.S. Inc., Santa Clara, CA (US)

(72) Inventors: Balaji Jayaraman, Hyderabad (IN); Toshiaki Kirihata, Poughkeepsie, NY (US); Amit K. Mishra, Bangalore (IN)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 17/220,321

(22) Filed: Apr. 1, 2021

(51) Int. Cl.
*G11C 17/18* (2006.01)
*G11C 29/50* (2006.01)

(52) U.S. Cl.
CPC ........ *G11C 17/18* (2013.01); *G11C 29/50004* (2013.01)

(58) Field of Classification Search
CPC .................................................. G11C 17/18
USPC ............................................................ 365/63
See application file for complete search history.

(56) References Cited

U.S. PATENT DOCUMENTS

| | | | |
|---|---|---|---|
| 6,906,962 B2 | 6/2005 | Layman et al. | |
| 9,953,727 B1* | 4/2018 | Fifield | G11C 29/78 |
| 10,468,104 B1* | 11/2019 | Anand | H04L 9/3278 |
| 2014/0029362 A1* | 1/2014 | Adham | G11C 17/16 365/200 |
| 2015/0278551 A1* | 10/2015 | Iyer | G09C 1/00 726/34 |
| 2017/0053705 A1* | 2/2017 | Agarwal | G11C 16/14 |
| 2018/0158532 A1* | 6/2018 | Hunt-Schroeder | G11C 8/14 |
| 2020/0194048 A1* | 6/2020 | Roy | G11C 11/1695 |

OTHER PUBLICATIONS

Hunt-Schroeder et al., "14-nm FinFET 1.5 Mb Embedded High-K Charge Trap Transistor One Time Programmable Memory Using Differential Current Sensing", IEEE Solid-State Circuits Letters, vol. 1, No. 12, Dec. 2018, 4 pages.*

* cited by examiner

*Primary Examiner* — Muna A Techane
(74) *Attorney, Agent, or Firm* — David Cain; Andrew M. Calderon; Roberts Calderon Safran & Cole, P.C.

(57) ABSTRACT

The present disclosure relates to integrated circuits, and more particularly, to a method for identifying unprogrammed bits for one-time-programmable memory (OTPM) and a corresponding structure. In particular, the present disclosure relates to a structure including: a read circuit configured to perform at least one read operation at an address for a twin-cell one-time-programmable-memory (OTPM); and a comparison circuit configured to identify whether at least one bit of the address for the twin-cell OTPM has been programmed based on the at least one read operation.

13 Claims, 10 Drawing Sheets

STRUCTURES AND METHODS OF IDENTIFYING UNPROGRAMMED BITS FOR ONE-TIME-PROGRAMMABLE-MEMORY (OTPM)

FIELD OF THE INVENTION

The present disclosure relates to integrated circuits, and more particularly, to structures and methods of identifying unprogrammed bits for one-time-programmable memory (OTPM).

BACKGROUND

A one-time-programmable memory (OTPM) is a charge trap transistor based non-volatile memory which contains a twin cell circuit. In the twin cell circuit, data is stored when electrons are trapped in a gate dielectric. The trapped electrons (i.e., trapped charge) lead to a threshold voltage (Vt) shift on either the true transistor or complement transistor, which weakens the device.

Charge trap transistor (CTT) based storage arrays are typically standalone arrays which have a large overhead array. As an example, a charge trap transistor one-time-programmable-memory (CTT OTPM) sense amplifier exhibits an asymmetry between the true and complement field effect transistors (FETs) for margining between a "1" and "0". The asymmetry is more pronounced at larger threshold voltage (Vt) shifts. In the CTT OTPM with the twin-cell, the twin-cell does not have an initial state (i.e., 0 or 1), which makes it difficult to identify if the bits have been already programmed.

SUMMARY

In an aspect of the disclosure, a structure comprises: a read circuit configured to perform at least one read operation at an address for a twin-cell one-time-programmable-memory (OTPM); and a comparison circuit configured to identify whether at least one bit of the address for the twin-cell OTPM has been programmed based on the at least one read operation.

In another aspect of the disclosure, a structure comprises: a first twin-cell one-time-programmable memory (OTPM) which comprises a first set of plurality of twin-cell transistor memory arrays; a second twin-cell OTPM which comprises a second set of plurality of twin-cell transistor memory arrays; and a read circuit which comprises at least one sense amplifier connected to the first twin-cell OTPM and the second twin-cell OTPM through a plurality of bitlines.

In another aspect of the disclosure, a method comprises: performing at least one read operation at a predetermined address for a twin-cell one-time-programmable-memory (OTPM); and identifying whether at least one bit of the predetermined address for the twin-cell OTPM has been programmed based on the at least one read operation.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
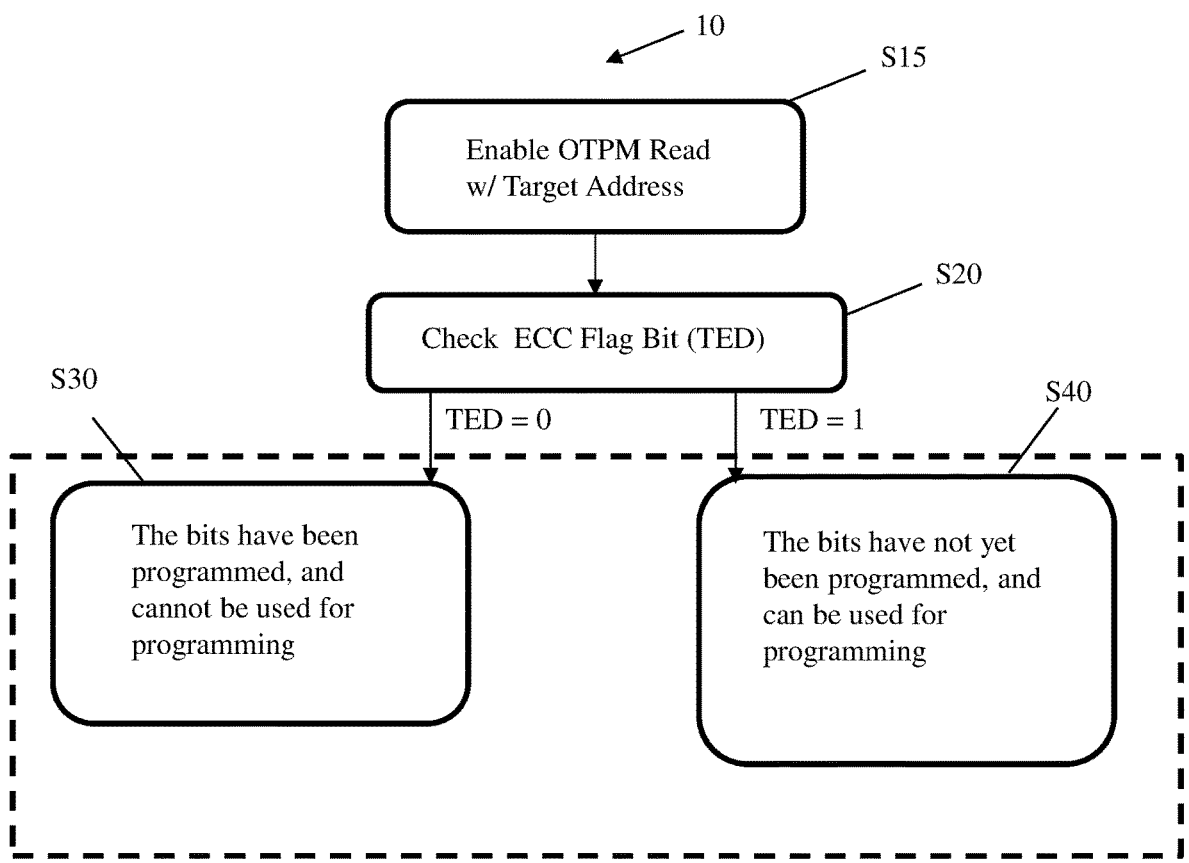
FIG. 1A shows a process for identifying unprogrammed bits for a one-time-programmable memory (OTPM) in accordance with aspects of the present disclosure.

The present disclosure relates to integrated circuits, and more particularly, to structures and methods of identifying unprogrammed bits for one-time-programmable memory (OTPM). More specifically, in the present disclosure, error correction circuit (ECC) flag bits may be used to identify if bits have been already programmed. In specific embodiments and advantageously, multiple ECC units may be used to improve accuracy of detection of programmed bits.

In particular, the present disclosure is directed to a method for identifying unprogrammed bits using at least one ECC unit which employs ECC flag bits as a Unit-Usage-Flag (UFF). In embodiments, at least two UFFs using multiple ECC flags can be OR'ed for generating a Block-Usage-Flag (BUF). Further, the UFF or BUF may be used for generating predetermined data output unless the memory cells have not yet been programmed. The present disclosure also relates to using a sense amplifier tilt feature to perform three different read operations for a twin-cell based one-time-programmable-memory (OTPM). This can be used to check for stability of bits to decide if the bits have already been programmed. In this way, the method and structures can identify unprogrammed bits using a sense amplifier tilt feature of the twin-cell based OTPM.

Known circuits use an electronic fuse (eFUSE) or any other non-volatile random access memory (NVRAM) to track the bits used for the CTT OTPM. In contrast, advantages of the present disclosure include identifying unprogrammed bits for the OTPM without address management using additional non-volatile random access memory (NVRAM) and creating default states for the memory without having default states. In particular, a circuit described herein merely requires checking of an ECC flag bit as the UFF or OR'ed ECC flag bits as the BUF to identify if the plurality of bits have already been programmed. The detection failure rate may be lower if using a plurality of ECC units (preferably, at least eight ECC units) for detecting whether a plurality of bits have already been programmed.

In further embodiments, the structure includes a read circuit (e.g., a sense amplifier) configured to perform at least one read operation at an address for a twin-cell one-time-programmable-memory (OTPM), and a comparison circuit (e.g., hardware memory controller or comparator) configured to identify whether at least one bit of the address for the twin-cell OTPM has been programmed based on the at least one read operation. In alternative embodiments, the structure includes a first twin-cell one-time-programmable memory (OTPM) which comprises a first set of plurality of twin-cell transistor memory arrays, a second twin-cell OTPM which comprises a second set of plurality of twin-cell transistor memory arrays, and a read circuit (e.g., at least one sense amplifier) connected to the first twin-cell OTPM and the second twin-cell OTPM through a plurality of bitlines. In another embodiment, a method includes performing at least one read operation at a predetermined address for a twin-cell one-time-programmable-memory (OTPM), and identifying whether at least one bit of the predetermined address for the twin-cell OTPM has been programmed based on the at least one read operation.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

FIG. 1A shows a process for identifying unprogrammed bits for a one-time-programmable memory (OTPM). In FIG. 1A, the process 10 includes steps S15-S40. In step S15, an OTPM read operation may be enabled with a target address of the OTPM. After the read operation may be performed, the ECC flag bit (i.e., TED) may be checked at step S20. If the ECC flag bit (i.e., TED) is zero, the bits have been programmed and cannot be used for programming in step S30. If the ECC flag bit (i.e., TED) is one, the bits have not yet been programmed, and can be used for programming in step S40.

Figure 1B:
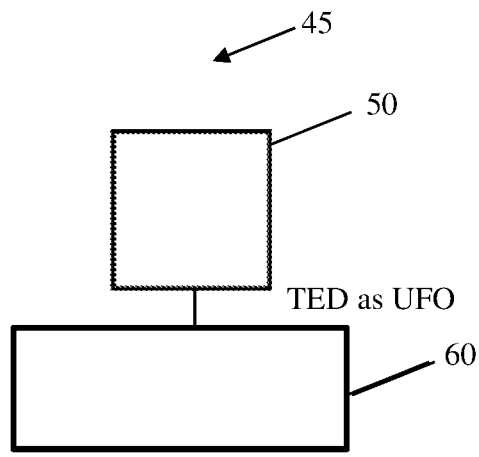
FIG. 1B shows a system for identifying unprogrammed bits for an OTPM in accordance with aspects of the present disclosure.

FIG. 1B shows a system for identifying unprogrammed bits for an OTPM. The system 45 includes an OTPM 50 and a memory controller 60 (e.g., a hardware memory controller 60). In particular, the OTPM 50 includes a target address which may be enabled with a read operation. After the read operation may be performed on the target address, the OTPM 50 may output an ECC flag bit (i.e., TED) as a Unit-Usage-Flag (UFF) to the memory controller 60.

Figure 1C:
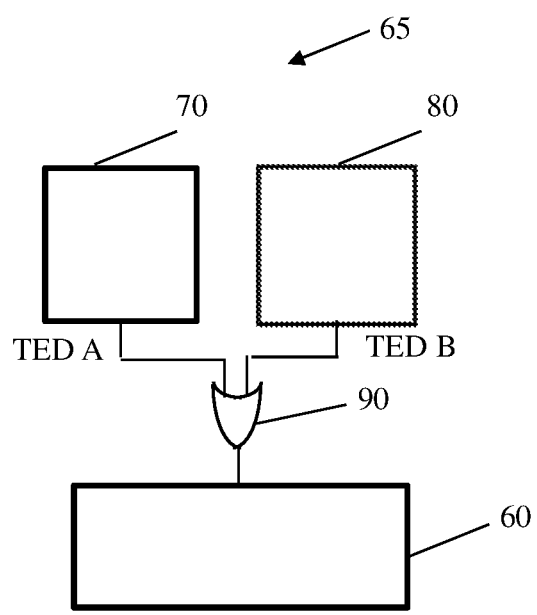
FIG. 1C shows a system for identifying unprogrammed bits for multiple OTPMs in accordance with aspects of the present disclosure.

FIG. 1C shows a system for identifying unprogrammed bits for multiple OTPMs. The system 65 includes OTPMs 70, 80 and the memory controller 60. In particular, the OTPMs 70, 80 have corresponding target addresses which may be enabled with corresponding read operations. After the read operations are performed on the corresponding target addresses, the OTPMs 70, 80 may output an ECC flag bit A (i.e., TED A) and an ECC flag bit B (i.e., TED B) to an OR gate 90. The OR gate 90 may output a signal to the memory controller 60 based on the ECC flag bit A (i.e., TED A) and the ECC flag bit B (i.e., TED B).

Figure 2:
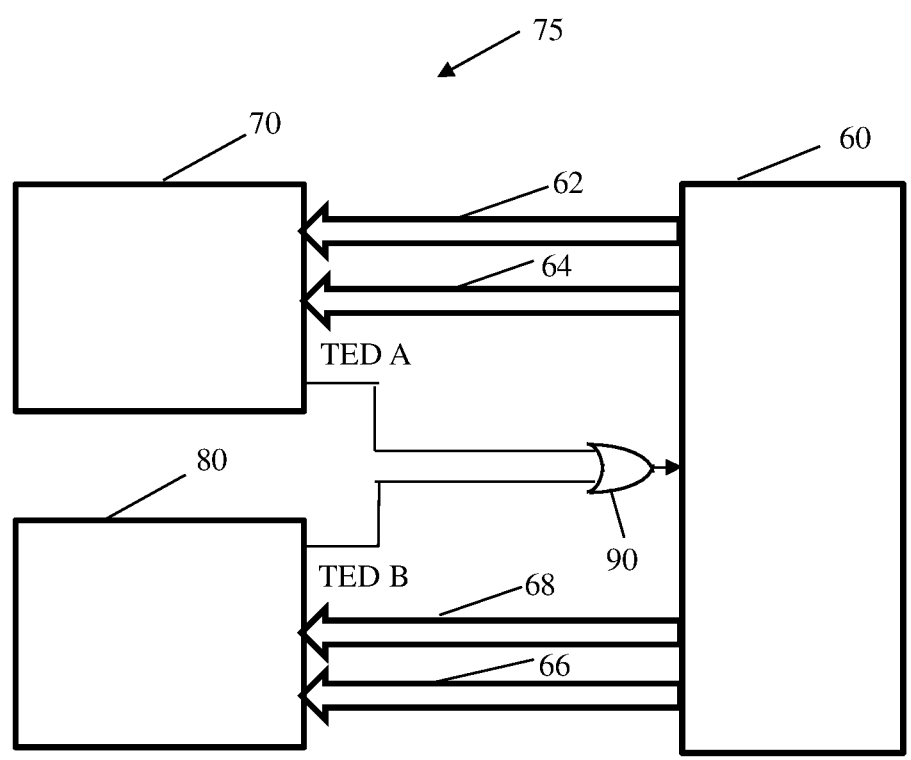
FIG. 2 shows another system for identifying unprogrammed bits for multiple OTPMs in accordance with aspects of the present disclosure.

FIG. 2 shows a system for identifying unprogrammed bits for multiple OTPMs. FIG. 2 is similar to FIG. 1C, with the exception of showing the flow of read address 62 and write address 64 between the memory controller 60 and the OTPMs 70, 80 for the system 75. For example, in FIG. 2, the memory controller 60 sends a read command with a read address 62 to perform a read operation at the read address 62 (i.e., target address) of the OTPM 70. The memory controller 60 also sends a read command with a read address 66 to perform the read operation at the read address 66 (i.e., target address) of the OTPM 80. The OTPM 70 outputs the ECC flag bit A (i.e., TED A) and ECC flag bit B (i.e., TED B) to the OR gate 90. The OR gate 90 outputs a signal (i.e., a buffer output signal) to the memory controller 60 based on the ECC flag bit A (i.e., TED A) and the ECC flag bit B (i.e., TED B).

In FIG. 2, the memory controller 60 may send a corresponding write command with a write address 64 to the OTPM 70 and a corresponding write command with a write address 68 to the OTPM 80 in response to the signal (i.e., the buffer output signal) indicating that a plurality of bits of one of the read address 62 and the read address 66 have not been programmed. If the memory controller 60 receives the signal (i.e., the buffer output signal) indicating that bits of the read address 62 and the read address 66 have been programmed, then the memory controller 60 does not send a write command to the OTPMs 70, 80 as the bits of the read addresses 62, 66 have already been programmed. Therefore, the TED signals (i.e., TED A and TED B) from at least one ECC unit or preferably from at least two ECC units (i.e., 8 ECC units) makes a data output go to a predetermined state (i.e., zero) unless the corresponding TED signals (i.e., TED A and TED B) are low. Thus, the memory controller 60 can manage a target address (i.e., read address) using the buffer output signal of the OR gate 90.

Figure 3:
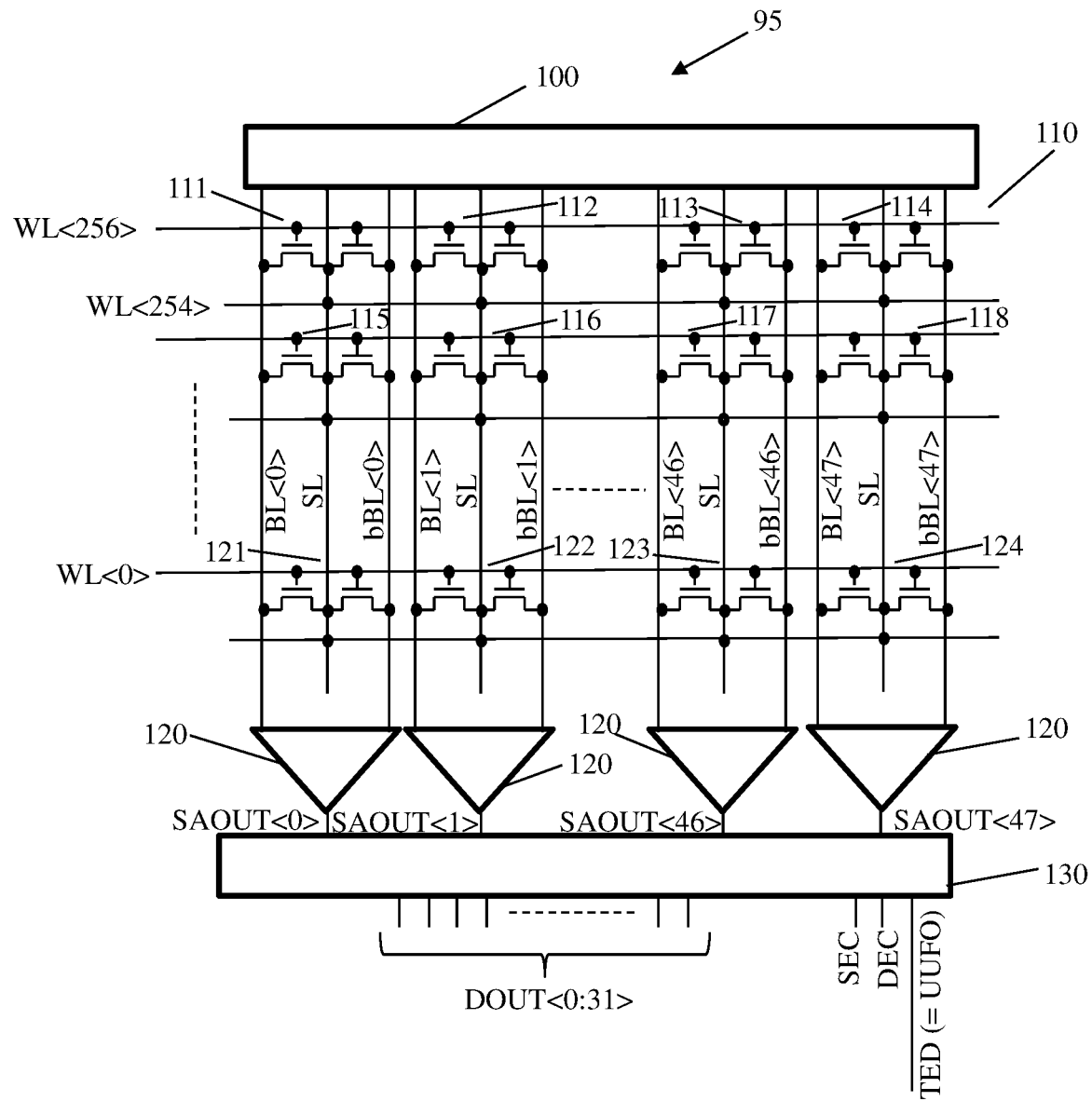
FIG. 3 shows a detailed structure for identifying unprogrammed bits for an OTPM in accordance with aspects of the present disclosure.

FIG. 3 shows a detailed structure for identifying unprogrammed bits for an OTPM in accordance with aspects of the present disclosure. The structure 95 includes bitline and sourceline drivers 100, a memory array 110, sense amplifiers 120, and an error detection logic 130. The memory array 110 includes wordlines WL<0> to WL<256>, bitlines BL<0> to BL<47>, a sourceline SL, complement bitlines bBL<0> to bBL<47>, and twin cell transistors 111-118, 121-124. The bitline and sourceline drivers 100 are connected to sense amplifiers 120 through the bitlines BL<0> to BL<47> and the complement bitlines bBL<0> to bBL<47>.

In FIG. 3, a memory controller may give a read command with a target address to the structure 95. In response to the read command, the sense amplifiers 120 can sense (i.e., read) the plurality of bits in the memory array 110 and output the sense amplifier output (i.e., SAOUT<0> to SAOUT<47>) to the error detection logic 130. The error detection logic 130 may output a TED signal (i.e., Unit-Usage-Flag (UFF)) with a low value (i.e., "0") to the memory controller when the plurality of bits in the memory array 110 have been already programmed. In contrast, the error detection logic 130 can output the TED signal (i.e., UFF) with a high value (i.e., "1") to the memory controller 60 when the plurality of bits in the memory array 110 have not been programmed. The memory controller 60 checks the TED signal (i.e., UFF) and then performs a write operation and/or read operation based on the TED signal (i.e., UFF).

Figure 4:
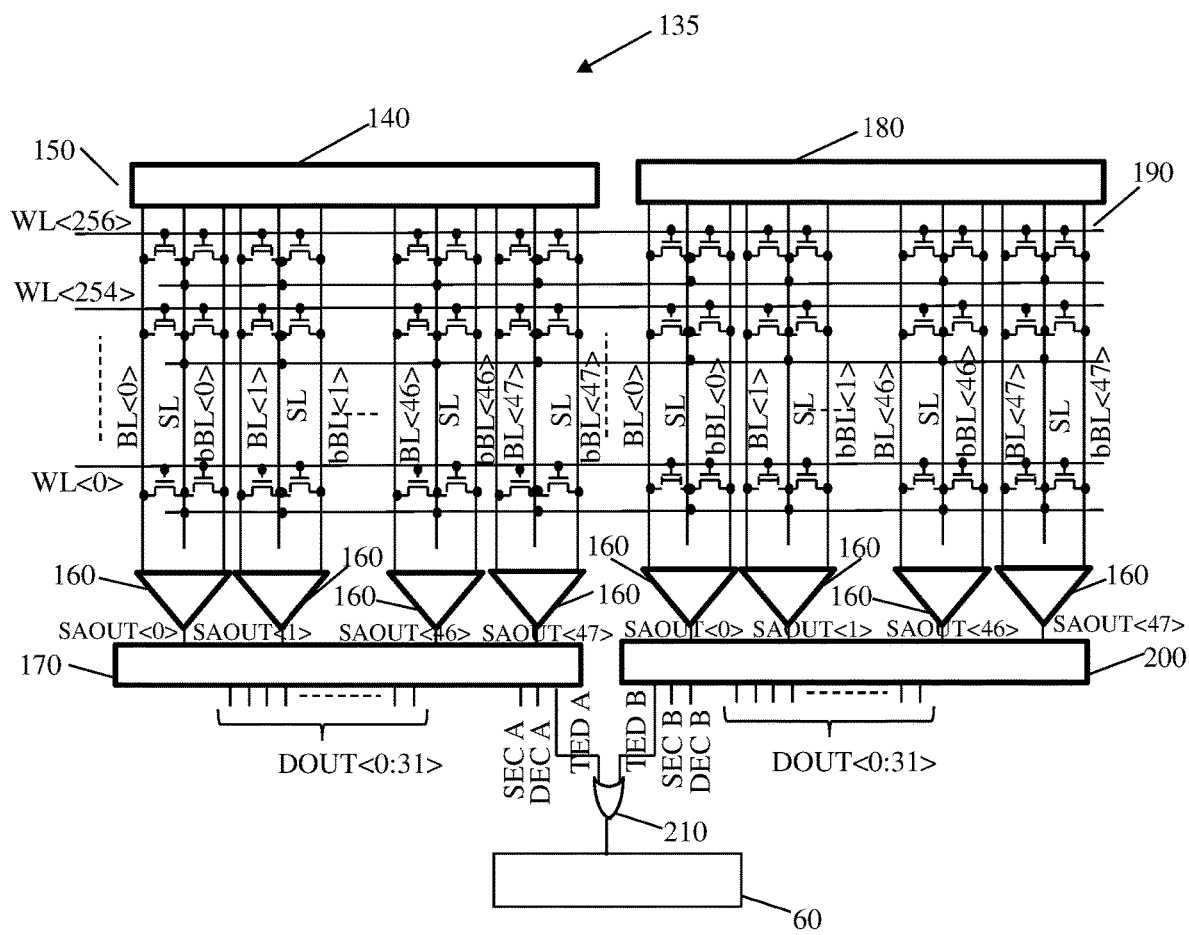
FIG. 4 shows a detailed structure for identifying unprogrammed bits for multiple OTPMs in accordance with aspects of the present disclosure.

FIG. 4 shows a detailed structure for identifying unprogrammed bits for multiple OTPMs in accordance with aspects of the present disclosure. FIG. 4 is similar to FIG. 3, except for the OR gate 210 receiving two TED signals (i.e., TED A and TED B) from error detection logic 170, 200 and outputting the buffer output signal. For example, the structure 135 includes bitline and sourceline drivers 140, 180, memory arrays 150, 190, sense amplifiers 160, and error detection logic 170, 200. The memory controller 60 uses the buffer output signal (i.e., Block-Usage-Flag-Output (BUFF)) generated by OR'ing at least two ECC Flag bits (i.e., TED A and TED B) by multiple OTPMs. In specific embodiments, the present disclosure can include greater than eight ECC Flag bits (i.e., greater than eight TED signals).

Similar to FIG. 3, the memory controller 60 in FIG. 4 may give a corresponding read command with a corresponding target address to the bitline and sourceline drivers 140 and 180. The sense amplifiers 160 can sense (i.e., read) the plurality of bits in the memory arrays 150 and 190 and output the corresponding sense amplifier outputs (i.e., SAOUT<0> to SAOUT<47>) to the error detection logic 170 and 200. The error detection logic 170 and 190 may output a corresponding TED signal (i.e., TED A and TED B) to the OR gate 210. The OR gate 210 outputs the buffer output signal to the memory controller 60 based on the TED signals (i.e., TED A and TED B).

For example, the buffer output signal may be a low value (i.e., "0") when both TED A=TED B="0" and the plurality of bits in the memory arrays 150 and 190 have already been programmed. In this scenario, the memory controller would receive the buffer output signal and not program (i.e., not send a write command) because the memory arrays 150 and 190 have already been programmed. In contrast, when one of the TED signal A and TED signal B="1", the buffer output may be a high value (i.e., "1") which indicates that one of the memory arrays 150 and 190 have not been programmed. In this scenario, the memory controller would receive the buffer output signal and program (i.e., send a write command) at least one of the memory arrays 150 and 190 because one of the memory arrays 150 and 190 have not been programmed.

Figure 5:
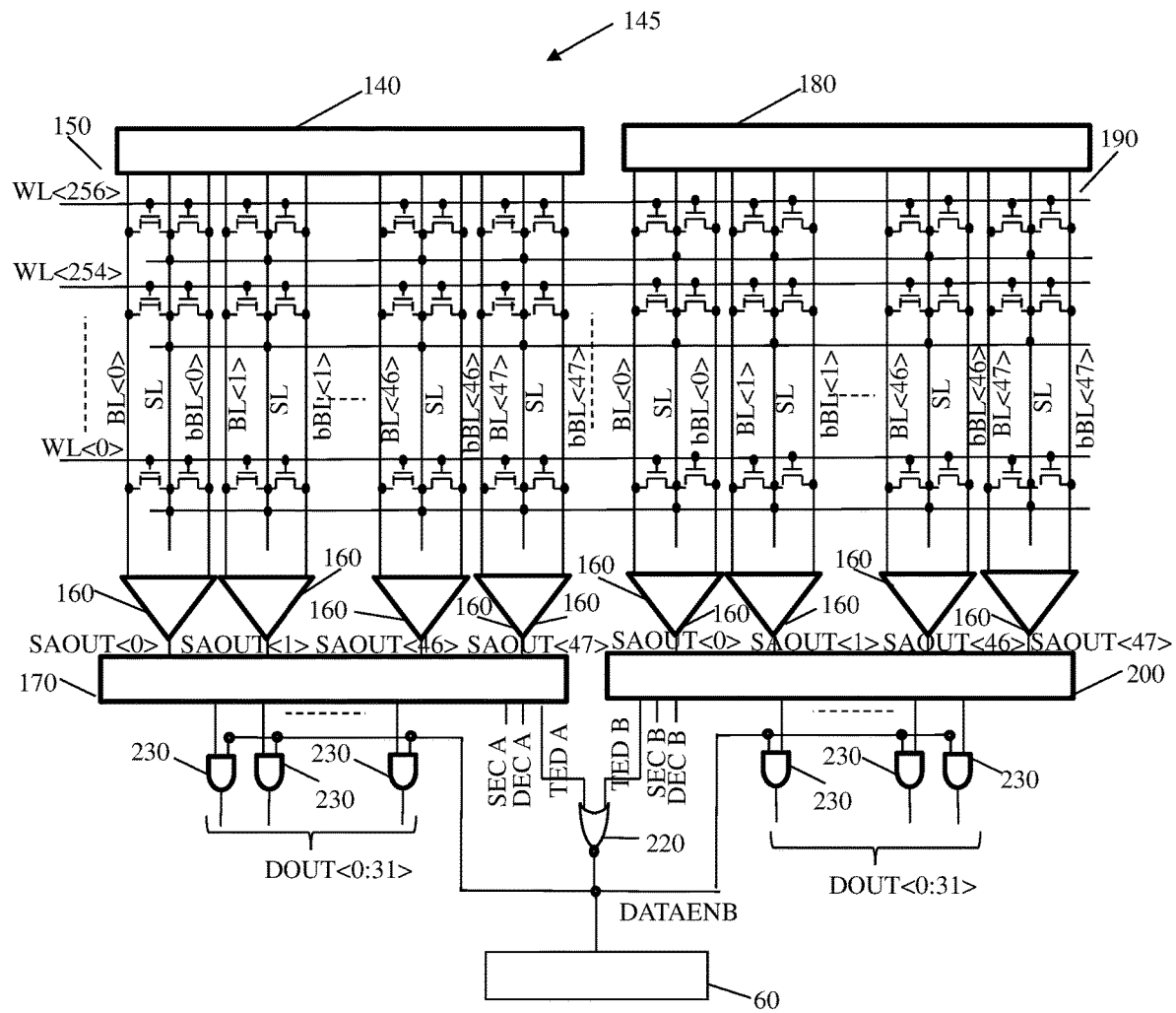
FIG. 5 shows a detailed structure for identifying unprogrammed bits for multiple OTPMs and outputting data in accordance with aspects of the present disclosure.

FIG. 5 shows a detailed structure for identifying unprogrammed bits for multiple OTPMs and outputting data in accordance with aspects of the present disclosure. FIG. 5 is similar to FIG. 4, except for the NOR gate 220 receiving two TED signals (i.e., TED A and TED B) from error detection logic 170, 200 and outputting the data enable signal DATAENB to the memory controller 60. For example, the structure 145 includes bitline and sourceline drivers 140, 180, memory arrays 150, 190, sense amplifiers 160, and error detection logic 170, 200. The data enable signal DATAENB may be fed back into AND gates 230. The AND gates 230 receive the data enable signal DATAENB and the output of the error detection logic 170, 200 such that the AND gates 230 output data output DOUT<0:31>.

In operation, when TED A and TED B are "0" (i.e., the plurality of bits of the memory arrays 150, 190 are identified as programmed), then the data enable signal DATAENB is high, e.g., "1". In this scenario, the programmed data may be output as the data output DOUT<0:31> from the AND gates 230 based on the DATAENB being "1". In contrast, when one of TED A and TED B is high, e.g., "1" (i.e., the plurality of bits of one of the memory arrays 150 and 190 are identified as not programmed), then the data enable signal DATAENB is low, e.g., "0". In this scenario, DOUT<0:31> may output "0" (i.e., not output any data from the memory arrays 150 and 190). Therefore, TED signals (i.e., TED A and TED B) from at least one ECC unit (e.g., preferably at least two ECC units) makes the data output go to a predetermined state (i.e., low state or "0") unless corresponding TED signals (e.g., TED A and TED B) are low (i.e., low state or "0").

Figure 6:
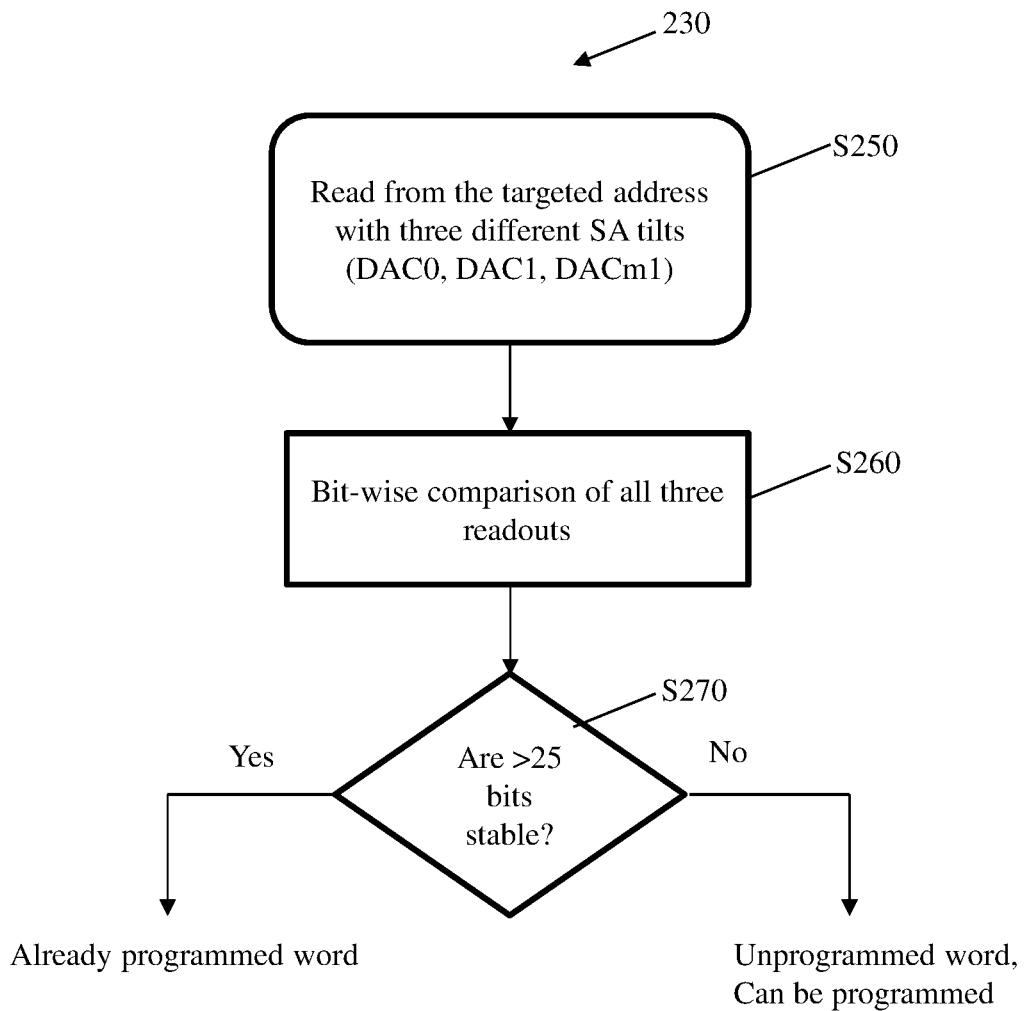
FIG. 6 shows a process for identifying unprogrammed bits for a one-time-programmable memory (OTPM) using a sense amplifier in accordance with aspects of the present disclosure.

FIG. 6 shows a process for identifying unprogrammed bits for a one-time-programmable memory (OTPM) using a sense amplifier in accordance with aspects of the present disclosure. In the process 230, a read operation (e.g., 32-bit read operation) may be performed at step S250 for a targeted address of the one-time programmable memory (OTPM) using three different sense amplifier tilts (i.e., no tilt for DAC0, tilt the sense amplifier by a fixed margin favoring "1" for DAC1, and tilt the sense amplifier by the fixed margin favoring "0" for DACm1). At step S260, a bit-wise comparison may be performed of all three readouts using the three different sense amplifier tilts (i.e., tilts at DAC0, DAC1, and DACm1). At step S270, a determination may be made whether greater than 25 bits are stable (out of a total of 32-bits). If greater than 25 bits are stable, then the word may be determined to be already programmed. If less than or equal to 25 bits are stable, then the word may be an unprogrammed word and the word can then be programmed by the OTPM. However, it is also contemplated that a determination can be made based on whether a stable percentage may be greater than a fixed percentage of the total bits (e.g., stable bits are greater than 75% of the total bits).

Figure 7:
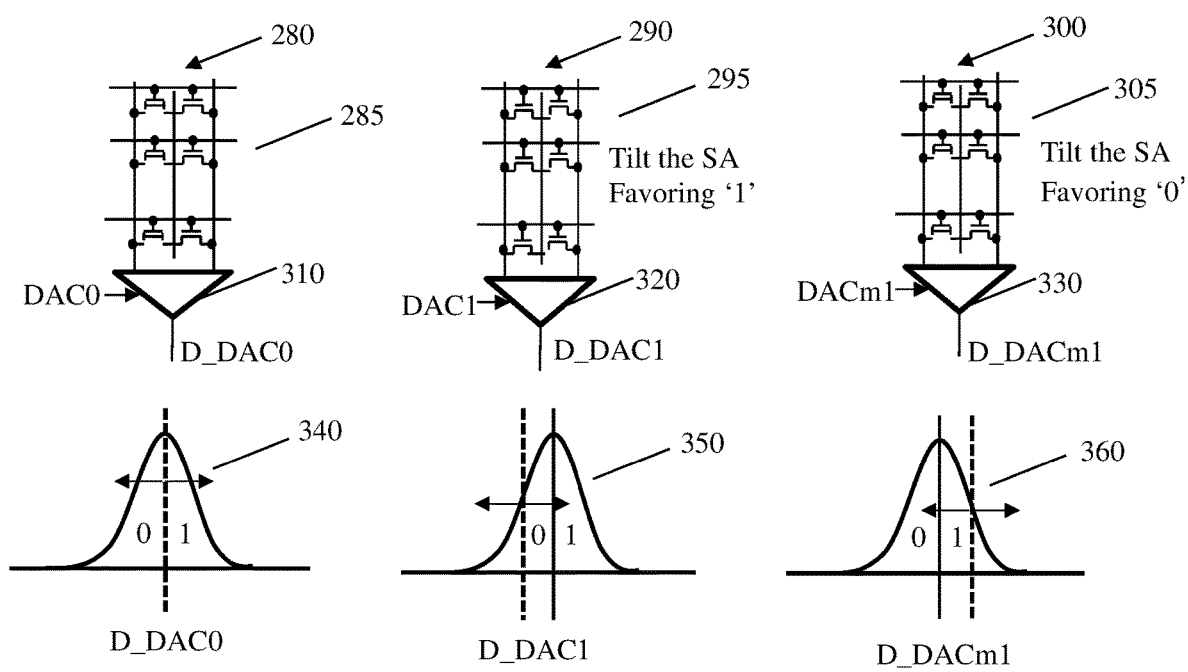
FIG. 7 shows sense amplifier tilt readouts for an unprogrammed word in the OTPM in accordance with aspects of the present disclosure.

FIG. 7 shows sense amplifier tilt readouts for an unprogrammed word in the OTPM in accordance with aspects of the present disclosure. In FIG. 7, the structure 280 includes a memory array 285 connected to a sense amplifier 310. In the structure 280, the sense amplifier 310 reads from a targeted address of the memory array 285 by receiving a DAC0 input (i.e., no tilt for the sense amplifier) and outputs a data output D_DAC0. A delta threshold voltage (Vt) distribution graph 340 for an unprogrammed word shows that there is an approximately 50% probability of "0" and an approximately 50% probability of "1" for D_DAC0.

FIG. 7 further shows a structure 290 comprising a memory array 295 connected to a sense amplifier 320. In operation, the sense amplifier 320 reads from a targeted address of the memory array 295 by receiving a DAC1 input (i.e., tilt the sense amplifier by a fixed margin favoring "1" for DAC1) and outputs a data D_DAC1. A delta threshold voltage (Vt) distribution graph 350 for an unprogrammed word shows that there is an approximately 20% probability of "0" and an approximately 80% probability of "1" for D_DAC1. In other words, by tilting the sense amplifier by the fixed margin favoring "1" for DAC1, the delta Vt distribution graph 350 shows that the distribution of the data D_DAC1 may favor "1".

FIG. 7 further shows a structure 300 comprising a memory array 305 connected to a sense amplifier 330. In operation, the sense amplifier 330 reads from a targeted address of the memory array 305 by receiving a DACm1 input (i.e., tilt the sense amplifier by a fixed margin favoring "0" for DACm1) and outputs a data D_DACm1. A delta threshold voltage (Vt) distribution graph 360 for an unprogrammed word shows that there is an approximately 80% probability of "0" and an approximately 20% probability of "1" for D_DACm1. In other words, by tilting the sense amplifier by the fixed margin favoring "0" for DACm1, the delta Vt distribution graph 360 shows that the distribution of the data D_DACm1 may favor "0".

Figure 8:
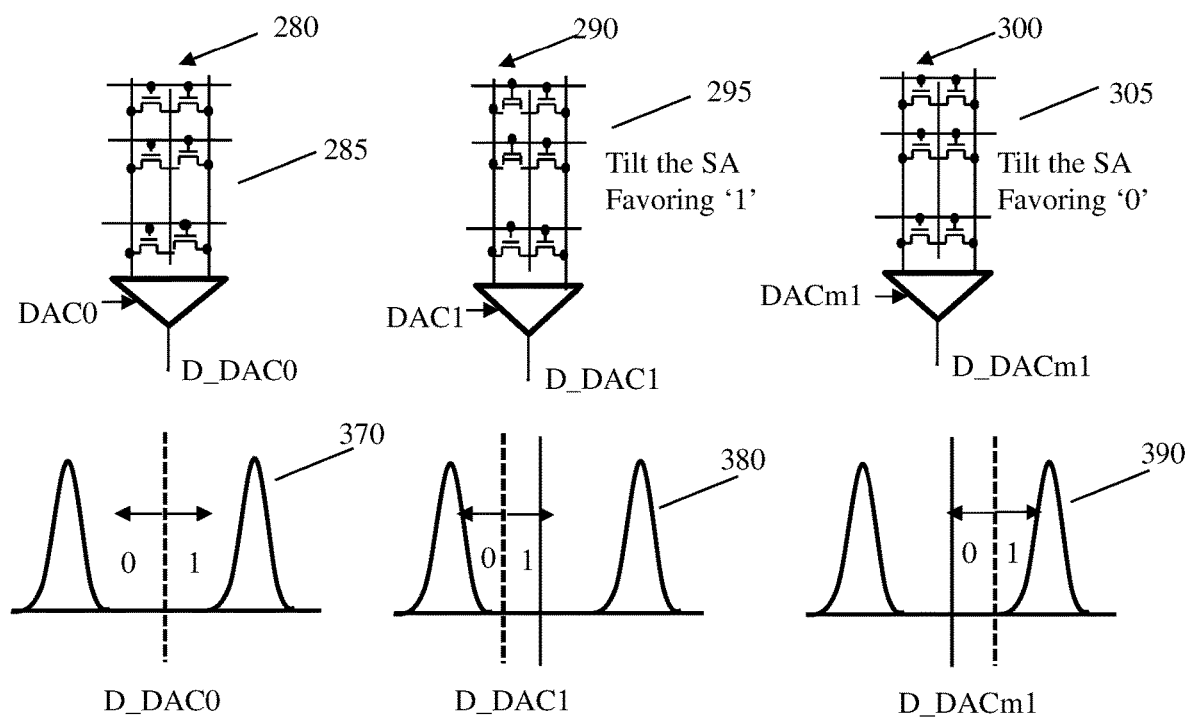
FIG. 8 shows sense amplifier tilt readouts for a programmed word in the OTPM in accordance with aspects of the present disclosure.

FIG. 8 shows sense amplifier tilt readouts for a programmed word in the OTPM in accordance with aspects of the present disclosure. FIG. 8 is similar to FIG. 7, except that the delta Vt distribution graphs 370, 380, and 390 correspond with sense amplifier inputs DAC0, DAC1, and DACm1. In particular, a delta threshold voltage (Vt) distribution graph 370 for a programmed word shows that there is an approximately 50% probability of "0" and an approximately 50% probability of "1" for D_DAC0. A delta Vt distribution graph 380 for the programmed word shows that there is an approximately 50% probability of "0" and an approximately 50% probability of "1" for D_DAC1. A delta Vt distribution graph 390 for the programmed word shows that there is approximately 50% probability of "0" and an approximately 50% probability of "1" for D_DACm1.

Figure 9:
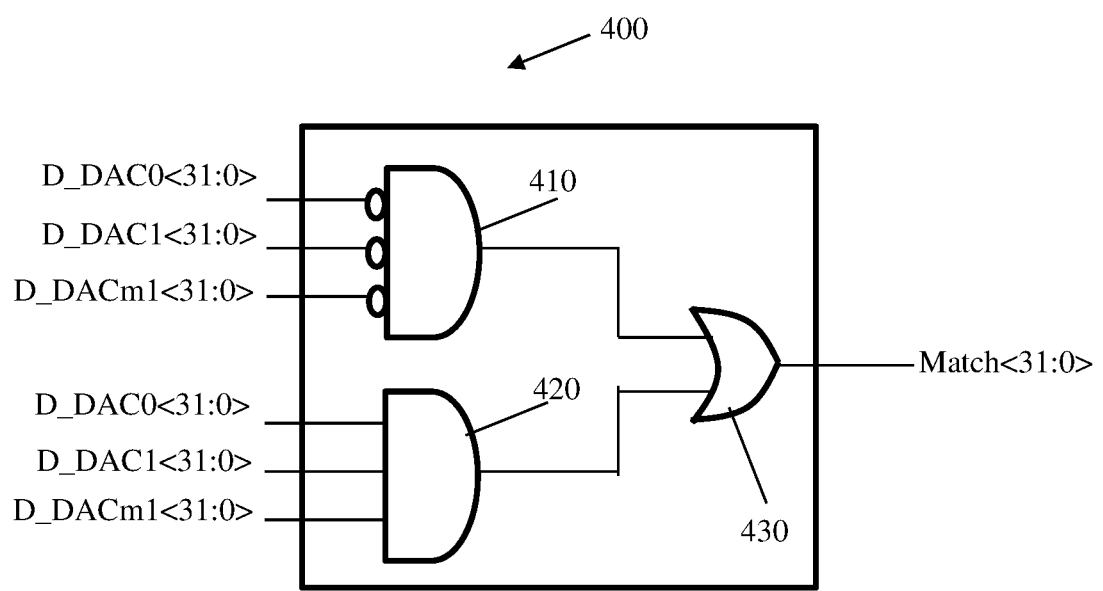
FIG. 9 shows a comparison structure in accordance with aspects of the present disclosure.

FIG. 9 shows a comparison structure in accordance with aspects of the present disclosure. In FIG. 9, the structure 400 includes AND gates 410, 420 and an OR gate 430. The AND gate 410 receives data outputs D_DAC<31:0>, D_DAC1<31:0>, and D_DACm1<31:0> which are low, e.g., "0", and outputs a signal to a comparator 430. The AND gate 420 receives data outputs D_DAC<31:0>, D_DAC1<31:0>, and D_DACm1<31:0> which are high, e.g., "1", and outputs another signal to the comparator 430. The comparator 430 receives outputs from the AND gates 410 and 420 and outputs a Match<31:0> signal. The number of "1"s in the Match<31:0> signal indicates the number of bits that are stable across three readouts (i.e., D_DAC0, D_DAC1, and D_DACm1). In particular, the number of "1"s may usually be under 10 for an unprogrammed word and be greater than 25 for a programmed word. In another embodiment, the AND gates 410 and 420 may only receive D_DAC1 and D_DACm1 to output to the comparator 430.

As an example, for a 48-bit programmed word in the OTPM, the number of stable bits may be greater than or equal to 47. Further, the number of stable bits may be less than or equal to 17 for a 48-bit unprogrammed word in the OTPM. In another example, redundancy support includes a 128 row redundancy for full flexibility for memory.

In another OTPM example, a redundancy write can include a first step of reading one wordline (i.e., one ECC segment) with three different sense amplifier tilt settings (e.g., DAC0, DAC1, and DAC9). If greater than 25 bits match, the word can be used for a redundancy vector storage solution. Otherwise, the word is already programmed. In a second step of the redundancy write, two redundancy solution vectors are written into each ECC segment.

In another OTPM example, a redundancy read can include reading one wordline (i.e., one ECC segment) with three different sense amplifier tilt settings (e.g., DAC0, DAC1, and DAC9). If greater than 25 bits match, the word can be used for a redundancy vector storage solution. Otherwise, the word is already programmed. In a second step of the redundancy read, if redundancy is enabled, then a redundancy replacement follows a master-bit for each redundancy solution stored in the OTPM. These scenarios describe a situation in which two redundancy vectors are written into each segment. However, multiple vectors can be written into each ECC segment (i.e., depending on the number of bits needed for redundancy vector address storage) and per vector (i.e., master flag indicates if redundancy is used).

The structures and methods of identifying unprogrammed bits for one-time-programmable memory (OTPM) can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as Smartphones) and edge computing markets. SoC is also commonly used in embedded systems and the Internet of Things.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a read circuit configured to perform at least one read operation at an address for a twin-cell one-time-programmable-memory (OTPM); and
    a comparison circuit configured to identify whether at least one bit of the address for the twin-cell OTPM has been programmed based on the at least one read operation,
    wherein the comparison circuit checks an error correction circuit (ECC) flag bit of the twin-cell OTPM to identify whether the at least one bit of the address for the twin-cell OTPM has been programmed,
    the read circuit performs another read operation at another address for a second twin-cell OTPM,
    the comparison circuit checks another ECC flag bit of the second twin-cell OTPM to identify whether another bit of the another address for the second twin-cell OTPM has been programmed, and
    an OR gate receives the ECC flag bit and the another ECC flag bit and outputs a block usage flag output (BUF).

2. The structure of claim 1, wherein the ECC flag bit is low in response to the at least one bit of the twin-cell OTPM being programmed.

3. The structure of claim 1, wherein the ECC flag bit is high in response to the at least one bit of the twin-cell OTPM not being programmed.

4. The structure of claim 1, wherein the read circuit comprises a sense amplifier which performs read operations at the address for the twin-cell OTPM.

5. The structure of claim 4, wherein the read operations comprise a first read operation which tilts a threshold voltage for the twin-cell OTPM towards "1", a second read operation which tilts the threshold voltage for the twin-cell OTPM towards "0", and a third read operation which does not tilt the threshold voltage for the twin-cell OTPM.

6. The structure of claim 4, wherein the comparison circuit checks a plurality of bits of the address in the read operations to determine a number of stable bits across the read operations and output the number of stable bits across the read operations.

7. The structure of claim 1, wherein the comparison circuit determines that at least one bit of the predetermined address is programmed in response to a number of stable bits across different read operations being above a programmed threshold.

8. The structure of claim 1, wherein the twin-cell OTPM connects to a sense amplifier which receives a sense amplifier tilt and performs read operations at the address, and the comparison circuit comprises at least one AND gate and the OR gate.

9. A structure, comprising:
a first twin-cell one-time-programmable memory (OTPM) which comprises a first set of plurality of twin-cell transistor memory arrays;
a second twin-cell OTPM which comprises a second set of plurality of twin-cell transistor memory arrays; and
a read circuit comprising at least one sense amplifier connected to the first twin-cell OTPM and the second twin-cell OTPM through a plurality of bitlines,
wherein the read circuit performs a first read operating at a first predetermined address for the first twin-cell OTPM and a second read operation at a second predetermined address for the second twin-cell OTPM,
a comparison circuit which comprises a hardware memory controller which:
identifies whether at least one bit of the first predetermined address for the first twin-cell OTPM has been programmed and whether at least one bit of the second predetermined address for the second twin-cell OTPM has been programmed based on the first read operation and the second read operation;
check a first error correction circuit (ECC) flag bit of the first twin-cell OTPM to identify whether the at least one bit of the first predetermined address for the first twin-cell OTPM has been programmed, and
an OR gate which receives the first ECC flag bit from the first twin-cell OTPM and the second ECC flag bit from the second twin-cell OTPM and outputs a block usage flag output (BUF) to the hardware memory controller.

10. The structure of claim 9, further comprising a NOR gate which receives the first ECC flag bit from the first twin-cell OTPM and the second ECC flag bit from the second twin-cell OTPM and outputs a data enable signal to an AND gate, and the AND gate outputs programmed data in response to the data enable signal indicating that at least one of the first predetermined address and the second predetermined address has been programmed.

11. The structure of claim 9, wherein the at least one sense amplifier:
performs three read operations at the first address for the first twin-cell one OTPM, and the three read operations comprise a first read operation which tilts a threshold voltage for the first twin-cell OTPM towards one, a second read operation which tilts the threshold voltage for the first twin-cell OTPM towards zero, and a third read operation which does not tilt the threshold voltage for the first twin-cell OTPM; and
perform three read operations at the second address for the OTPM, and the three read operations comprise a first read operation which tilts a threshold voltage for the second twin-cell OTPM towards one, a second read operation which tilts the threshold voltage for the second twin-cell OTPM towards zero, and a third read operation which does not tilt the threshold voltage for the second twin-cell OTPM.

12. A method, comprising:
performing at least one read operation at a predetermined address for a twin-cell one-time-programmable-memory (OTPM); and
identifying whether at least one bit of the predetermined address for the twin-cell OTPM has been programmed based on the at least one read operation,
wherein the identifying whether at least one bit of the predetermined address for the twin-cell OTPM has been programmed further comprises checking an error correction circuit (ECC) flag bit of the twin-cell OTPM to identify whether the at least one bit of the predetermined address for the twin-cell OTPM has been programmed,
performing another read operation at another read address for another twin-cell OTPM,
checking another ECC flag bit of the another twin-cell OTPM to identify whether another bit of the another read address for the another twin-cell OTPM has been programmed, and
receiving the ECC flag bit and the another ECC flag bit and outputting a block usage flag output (BUF).

13. The method of claim 12, wherein the at least one read operation comprises a first read operation which tilts a threshold voltage for the twin-cell OTPM towards one, a second read operation which tilts the threshold voltage for the twin-cell OTPM towards zero, and a third read operation which does not tilt the threshold voltage for the twin-cell OTPM.

* * * * *